US010078800B2

(12) United States Patent
Suri et al.

(10) Patent No.: US 10,078,800 B2
(45) Date of Patent: Sep. 18, 2018

(54) ARTIFICIAL NEURON COMPRISING A RESISTIVE MEMORY HAVING A STOCHASTIC BEHAVIOR

(71) Applicant: COMMISSARIAT A L'ENERGIE ATOMIQUE ET AUX ENERGIES ALTERNATIVES, Paris (FR)

(72) Inventors: Manan Suri, Grenoble (FR); Giorgio Palma, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 449 days.

(21) Appl. No.: 14/315,069

(22) Filed: Jun. 25, 2014

(65) Prior Publication Data

US 2015/0006455 A1     Jan. 1, 2015

(30) Foreign Application Priority Data

Jun. 26, 2013 (FR) ........................ 13 56143

(51) Int. Cl.
| | |
|---|---|
| *G06N 3/063* | (2006.01) |
| *G06N 3/04* | (2006.01) |
| *G11C 11/54* | (2006.01) |
| *G11C 13/00* | (2006.01) |

(52) U.S. Cl.
CPC ............. *G06N 3/063* (2013.01); *G06N 3/049* (2013.01); *G06N 3/0635* (2013.01); *G11C 11/54* (2013.01); *G11C 13/0002* (2013.01)

(58) Field of Classification Search
None
See application file for complete search history.

(56) References Cited

U.S. PATENT DOCUMENTS

| | | | | |
|---|---|---|---|---|
| 2009/0230434 A1* | 9/2009 | Inaba | ................... | H01L 45/147 257/202 |
| 2013/0073497 A1* | 3/2013 | Akopyan | ............... | G06N 3/049 706/27 |
| 2013/0242640 A1* | 9/2013 | Haukness | .......... | G11C 13/0069 365/148 |

OTHER PUBLICATIONS

Shin et al. Neuronal Spike Event Generation by Memristors. 13th International Workshop on Cellular Nanoscale Networks and Their Applications (CNNA), 2012.*
Yang et al. Memristive devices for computing. Nature Nanotechnology. Published online Dec. 2012.*

(Continued)

*Primary Examiner* — Robert A Cassity
*Assistant Examiner* — Robert Bejcek, II
(74) *Attorney, Agent, or Firm* — Baker & Hostetler LLP (57) ABSTRACT

A circuit for implementing an artificial neuron comprises: an integrator for an input signal to produce a voltage signal; a signal generator linked to the integrator output producing two output signals when the voltage is at or above a predetermined voltage, a first signal for an output pulse of the neuron and a second signal for a control pulse; a resistive memory comprising two terminals switching from a high to low resistance state in a time following a statistical distribution specific to the memory, a first terminal linked to the output of the integrator; a transistor linked to a branch at zero potential to a second terminal of the resistive memory, controlled by the second output signal such that in the presence of a pulse of voltage the resistive memory switches from its high resistance state to its low resistance state with a view to lowering the voltage.

10 Claims, 6 Drawing Sheets

(56) References Cited

OTHER PUBLICATIONS

WhatIt.com. What is MOSFET. Published online Jun. 2012.*
M. Suri, et al. "Emerging Resistive Memory Technology for Synaptic Plasticity Emulation in Large-Scale Neuromorphic Systems", IEDM, 2011, pp. 4.4.1-4.4.4.
M. Suri, et al. "Emerging Resistive Memory Technology for Synaptic Plasticity Emulation in Large-Scale Neuromorphicc Systems", CEA-LETI Grenoble, IEDM, 2011.
J. Grollier, et al., "A Spintronic Memristor", Unite Mixte de Physique CNRS/Thales et Universite Paris Sud 11, France, Nov. 20, 2012.
J. Grollier, et al., "MemCo Workshop Invited Speakers Slides & Posters", Workshop on Memristors for Computing, Nov. 19-21, 2012, 4 pages, XP055110633; URL:http://www.trt.thalesgroup.com/ump-cnrs-thales/memco/slides.htm.
O. Bichler, "Contribution a la conception d'architecture de calcul auto-adaptative integrant des nanocomposants neuromorphiques et applications potentielles", These de doctorate de l'universite Paris-Sud, Nov. 14, 2012, URL: http://tel.archives-ouvertes.fr/tel-00781811 (English Abstract attached).
M. Suri, et al., "CBRAM Device as Binary Synapses for Low-Power Stochastic Neuromorphic Systems: Auditory (Cochlea) and Visual (Retina) Cognitive Processing Applications", International Electron Devices Meeting (IEDM), 2012, pp. 10.3.1 thru 10.3.4, IEEE.
Sangho Shin, et al., "Neuronal Spike Event Generation by Memristors", Proceedings of the 13th International Workshop on Cellular Nanoscale Networks and their Applications, Aug. 29, 2012, 4 pages, XP032253872.
M. Suri, "Emerging Resistive Memory Technology for Neuromorphic Systems and Applications", These de doctorate de l'universite de Grenoble, Sep. 18, 2013, 10 pages, XP055110630, URL:http://tel.archives-ouvertes.fr/tel-00935190.
O. Bichler, "Contribution a la conception d'architecture de-calcul auto-adaptative integrant des nanocomposants neuromorphiques et applications potentielles", These de doctorate de l'universite Paris SUD, Nov. 14, 2012, URL:http://tel.archives-ouvertes.fr/tel-00781811 (English Abstract attached).
M. Suri, et al. "Emerging Resistive Memory Technology for Synaptic Plasticity Emulation in Large-Scale Neuromorphic Systems", CEA-LETI Grenoble, IEDM, 2011.
J. Grollier, et al., "A Spintronic Memristor", Unite Mixte de Physique CNRS/Thales et Universite Paris Sud 11, France.
M. Suri, "Emerging Resistive Memory Technology for Neuromorphic Systems and Applications", These de doctorate de l'universite de Grenoble, Sep. 18, 2013, 10 pages, XP055110630, URL:http://tel.archives-ouvertes.fr/tel-00935190.
A. Joubert, "Neurone Analogique Robuste et Technologies Emergentes Pour les Architectures Neuromorphiques", These de doctorate de l'universite de Grenoble, Mar. 26, 2013, 24 pages, XP055110624, URL:http://tel.archives-ouvertes.fr/tel-00935178.
O. Bichler, "Contribution a la conception d'architecture de calcul auto-adaptative integrant des nanocomposants neuromorphiques et applications potentielles", These de doctorate de l'universite Paris-Sud, Nov. 14, 2012, URL: http://tel.archives-ouvertes.futel-00781811.

* cited by examiner

ARTIFICIAL NEURON COMPRISING A RESISTIVE MEMORY HAVING A STOCHASTIC BEHAVIOR

CROSS-REFERENCE TO RELATED APPLICATION

This application claims priority to foreign French patent application No. FR 1356143, filed on Jun, 26, 2013.

FIELD OF THE INVENTION

The invention relates to an artificial neuron comprising a resistive memory. It applies to the field of artificial neural networks and cognitive informatics. These networks are schematically inspired by the biological neural networks whose operation they imitate.

BACKGROUND

The technical field of neural networks and cognitive informatics has gained importance in recent years. Potential applications are under study notably for robotics, large-scale data analysis and intelligent autonomous systems and bio-inspired computation. Artificial neural networks are essentially composed of neurons mutually interconnected by synapses. The synapses are usually implemented by digital memories or resistive components whose conductance varies as a function of the voltage or of the current applied across their terminals.

Two known techniques can be used to implement stochasticity in neuromorphic systems. They are described in the article by M. Suri et al. titled *CBRAM devices as binary synapses for low-power stochastic neuromorphic systems: Auditory (Cochlea) and visual (Retina) cognitive processing applications*, International Electron Devices Meeting (IEDM) pp. 10.3.1-10.3.4 (2012).

The first technique consists in introducing stochasticity using PRNG (Pseudo-Random Noise Generator) random number generating circuits. These circuits occupy a large surface area of silicon and are complicated to design. Thus, if the number of synapses and neurons in the neural network is high, a large part of the surface area of the electronic chip implementing the neuromorphic system will be devoted to the implementation of external random number generating circuits. Indeed, a large number of transistors are required to implement the various logic gates of the PRNG circuits. If the random number generating circuits are implemented outside the electronic chip of the neuromorphic system, the phenomenon of power dissipation can then become considerable.

The second technique uses the physical properties of devices based on resistive memories used for implementing the synapses. The main drawback of this second technique is its lack of flexibility. The programming conditions used to obtain a switching from one intrinsically probabilistic or stochastic state to another depend on the technology and on the materials used to fabricate the synaptic devices. Thus, if devices of CBRAM (Conductive-Bridge Random Access Memory) type are chosen, their intrinsic programming conditions cannot be reused for another synaptic technology. Moreover, synaptic devices can deteriorate when they are used frequently. As a consequence, their programming conditions can change over time.

SUMMARY OF THE INVENTION

One of the aims of the invention is notably to remedy the aforementioned drawbacks.

For this purpose, the subject of the invention is a circuit for implementing an artificial neuron, said circuit comprising:
- an integrator configured to integrate an input signal in such a way as to produce at the output a signal of voltage Vmem;
- a signal generator linked to the output of the integrator and configured to produce two output signals when the voltage Vmem is above or equal to a predetermined voltage Vth, a first signal corresponding to an output pulse of the neuron and a second signal corresponding to a control pulse Vout;
- a resistive memory comprising two terminals and able to switch from a high resistance state to a low resistance state in a time Tset following a statistical distribution specific to said memory, a first terminal being linked to the output of the integrator;
- a transistor linked to a branch at zero potential as well as to a second terminal of the resistive memory, said transistor being furthermore configured to be controlled by the second output signal of the signal generator in such a way that in the presence of a pulse of voltage Vout the resistive memory switches from its high resistance state to its low resistance state with a view to lowering the voltage Vmem.

According to one aspect of the invention, the resistive memory (708, 1008) is chosen from among the following technologies: CBRAM, PMC, EMC, PCM, OXRAM, MRAM or STT-RAM.

The transistor Q1 is for example of MOSFET type.

According to one aspect of the invention, the resistive memory is reset to a high resistance state after each switch to the low resistance state. This reset is for example carried out as soon as the emission of an output pulse of the neuron is terminated.

The integrator is for example implemented by a capacitance linked to the branch at zero potential.

In one embodiment, the resistive memory is bipolar. Alternatively, the resistive memory can be unipolar.

Another subject of the invention is a neuromorphic system comprising a set of at least one input neuron, a set of at least one output neuron and a synaptic network, said synaptic network linking the input neurons to the output neurons, the set of at least one input neuron and/or the set of at least one output neuron being implemented by at least one circuit as previously described.

BRIEF DESCRIPTION OF THE DRAWINGS

Other features and advantages of the invention will become apparent thanks to the following description, given by way of non-limiting illustration and made with reference to the appended drawings among which.

DETAILED DESCRIPTION

Figure 1:
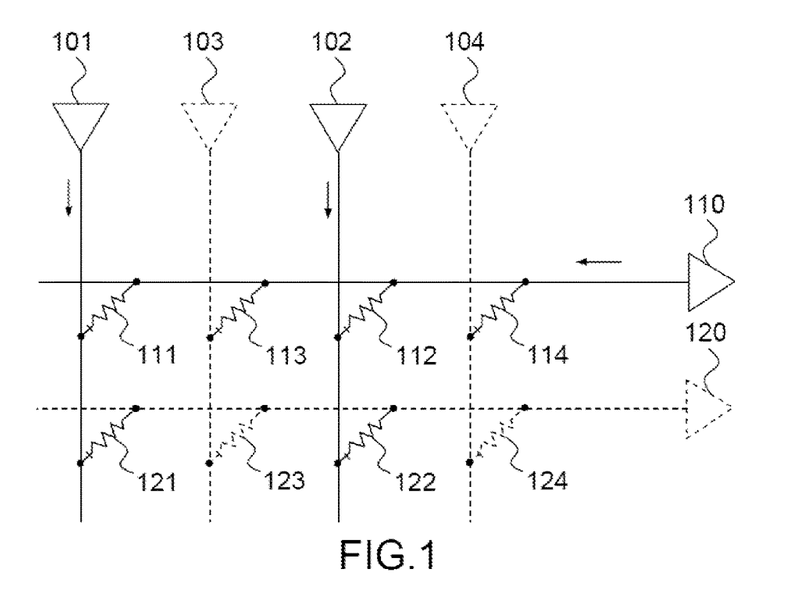
FIG. 1 represents a functional schematic diagram of an artificial neural network of the prior art.

FIG. 1 represents a functional schematic diagram of an artificial neural network of the prior art.

A plurality of input neurons 101, 102, 103, 104 are connected to a plurality of output neurons 110, 120 by way of a plurality of artificial synapses 111, 112, 113, 114, 121, 122, 123, 124. An artificial synapse can be produced by means of a memristive device, also called resistive memory, whose conductance G varies as a function of the current or of the voltage applied across its terminals. A synapse 111 has one of its two terminals connected to an input neuron 101 and the other terminal connected to an output neuron 110. An artificial neuron is an active component that can exhibit, simultaneously or separately, the function of input neuron and/or of output neuron. An artificial neuron is called input neuron when it is connected downstream of a synapse and output neuron when it is connected upstream of a synapse. Artificial neurons can be active or inactive. In FIG. 1, by way of example, the input neurons 101, 102 are considered active and the input neurons 103, 104 inactive. Similarly, the output neuron 110 is active whereas the output neuron 120 is inactive. A neuron is active when it emits a pulse at the instant in question. The duration of its "active" state can be predetermined.

Figure 2:
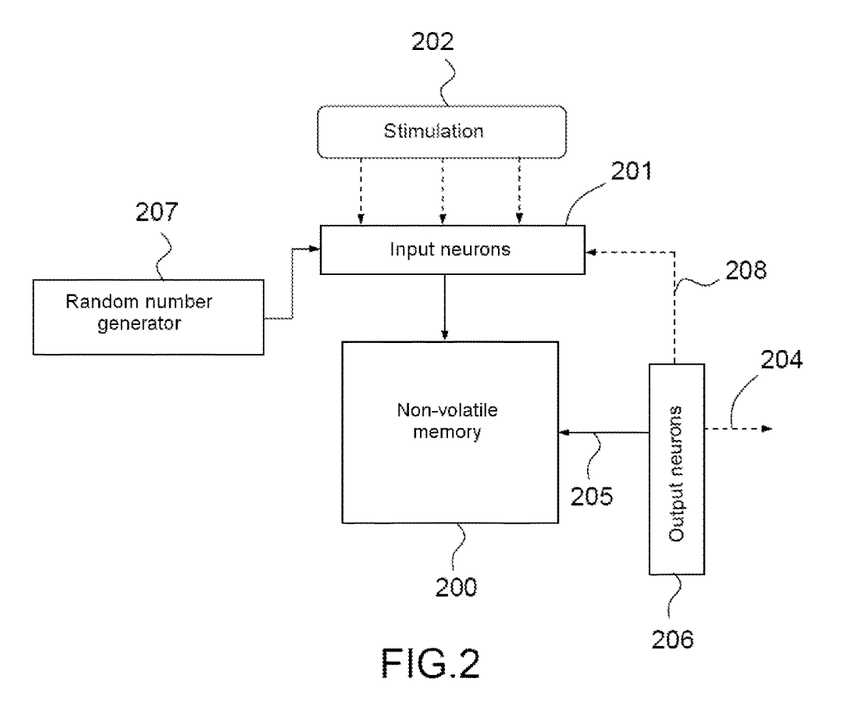
FIG. 2 gives an example of a neuromorphic system capable of implementing the invention.

FIG. 2 gives an example of a neuromorphic system capable of implementing the invention.

Such a system can be implemented on a single dedicated circuit, on a programmable circuit or using a combination of the two. Thus, certain parts can be implemented by software and others using dedicated architectures.

This system is composed of four main blocks. A first block 200 implements a non-volatile memory matrix or a memory of "crossbar" type.

A block 201 comprising input neurons is used for generating input signals which will be injected into the memory block 200. Various types of neuron models can be used. By way of example, neurons of LIF (Leaky Integrate-and-Fire) type can be used. Other types of artificial neurons such as for example S-LIF (Stochastically firing LIF) neurons can advantageously be used.

The input neurons can be stimulated by a block 202 generating stimulation signals usually denoted by the term "spikes". This block emulates for example the inner ear and in particular the cochlea. Other applications can also be considered. Another example is to use an artificial retina as a stimulation block 202. In a more general way, the block 202 can be a source of any type of digital or analogue, asynchronous or synchronous data used as input for carrying out shape recognition, pattern classification or signal processing. This model can be based on a biological model.

A block 206 comprising output neurons is used to generate the output signals 204 of the neuromorphic system. These neurons generate in certain cases signals 205, 208 making it possible to implement learning by the memory matrix comprising the synapses.

A random number generator 207 can be used with the aim of deploying in a part of the memory circuit any type of probabilistic or stochastic learning rule, such as for example an STDP rule.

The complexity of the neuron blocks 201 depends on the functionality deployed in the neural network and the biological models chosen to program it. Neural devices notably of LIF or S-LIF type can be used to implement the block 201.

Figure 3:
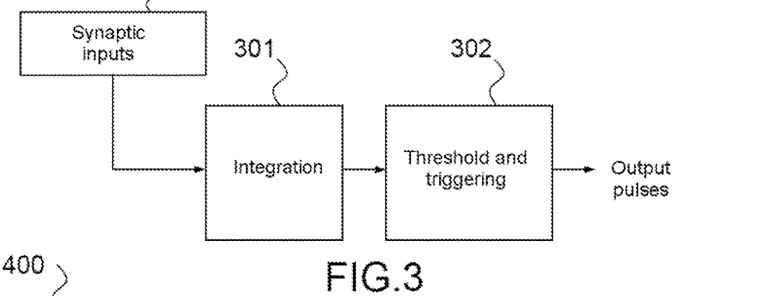
FIG. 3 schematically illustrates the principle of a neural device of LIF type.

FIG. 3 schematically illustrates the principle of a neural device of LIF type.

Electrical signals originating for example from the synapses of a 300 pass through an integrator 301 whose function is to sum the incoming synaptic inputs or incoming currents using components such as capacitors. This integration leads to an increase in the potential of the neural membrane.

A threshold detection block 302 is also used. When the potential of the membrane reaches a predefined threshold value, the output neuron generates an output pulse. After the neuron has fired, i.e. it has generated such an output pulse, the membrane potential rises back up to a rest value called the initial state.

A LIF neuron operates deterministically. Indeed, an output pulse is emitted as soon as the membrane potential reaches a predefined threshold value.

In the remainder of the description, a new type of artificial neuron called stochastically-triggered LIF neuron is described. This type of neuron can be denoted using the acronym S-LIF (stochastically firing LIF).

Figure 4:
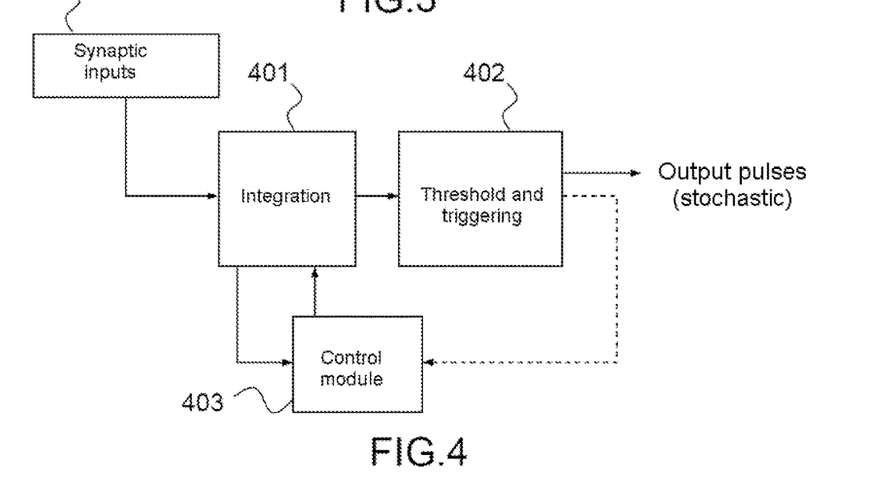
FIG. 4 presents in a simplified manner the architecture of an artificial neuron of S-LIF type.

FIG. 4 presents in a simplified way the architecture of an artificial neuron of S-LIF type.

An artificial neuron of S-LIF type can receive as input the electrical signals originating for example from synapses. As for the case of a neuron of LIF type, a neuron of S-LIF type comprises an integrator 401 and a threshold detection and output pulse generation block 402. Furthermore, it comprises a stochastic control module 403.

This type of artificial neuron makes it possible to obtain stochastic triggering of the output pulses. To do this, the triggering of the neuron, i.e. the generation of an output pulse, is not perfectly synchronized with the instant at which the threshold value Vth is exceeded by the voltage of the signal of the integration. Indeed, an output pulse is generated after a delay Tset corresponding to the time required to make the resistive memory flip with a given voltage, the value of this delay varying from one emission of an output pulse to another as a function of a given probability distribution. To do this, a module 43 of stochastic control of the neuron associated with this distribution can be advantageously used. This module can be implemented using a resistive memory, this type of memory comprising stochastic switching properties.

CBRAM technology, also called PMC (Programmable Metallization Cell) or EMC (Electrochemical Metallization Cell), is taken as an example of resistive memory in the remainder of the description, but the invention is also applicable to other types of resistive memories with nanoscale technologies, such as for example PCM (Phase Change Memory) or OXRAM (Oxide Based Memory) technologies. It can furthermore be applied to magnetic memories such as MRAMs (Magnetoresistive Random-Access Memory) or STT-RAM (Spin-Transfer Torque Random Access Memory) memories.

Figure 5:
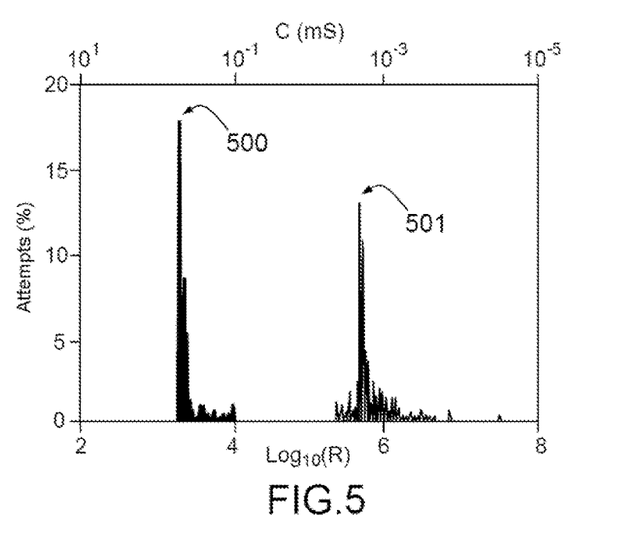
FIG. 5 illustrates the two states of a resistive memory of CBRAM type as well as the dispersion of the resistance values associated with these states.

FIG. 5 illustrates the two states of a resistive memory of CBRAM type as well as the dispersion of the resistance values associated with these states.

The abscissae of this figure correspond to the base 10 logarithm of the resistance of the CBRAM memory. The value of the conductance C expressed in millisiemens (mS) is also indicated. The ordinates correspond to the percentage of switching attempts of the resistive memory having made it possible to obtain a given resistance value.

The principle of this type of resistive memory relies on the formation of a conductive filament allowing a transition between a low state and a high state of resistance. A CBRAM resistive memory is of bipolar type because a positive voltage must be applied across its terminals to obtain the low resistance state and a negative voltage to obtain the high resistance state. However, the resistance values obtained after having switchedd the memory from one state to the other are not always the same. FIG. 5 shows two peaks 500, 501 corresponding to the resistance values associated with the low and high states respectively. The existence of a phenomenon of dispersion of the resistance values in the neighbourhood of these two peaks 500, 501 is revealed by this figure. Indeed, other resistance values can be obtained than those associated with the two main peaks 500, 501 due to the existence of secondary peaks dispersed around said two main peaks. Thus, it is shown that the switching from the high state to the low state and vice versa is not entirely deterministic because two statistical distributions appear in the neighbourhood of the two main peaks 500, 501.

Figure 6A:
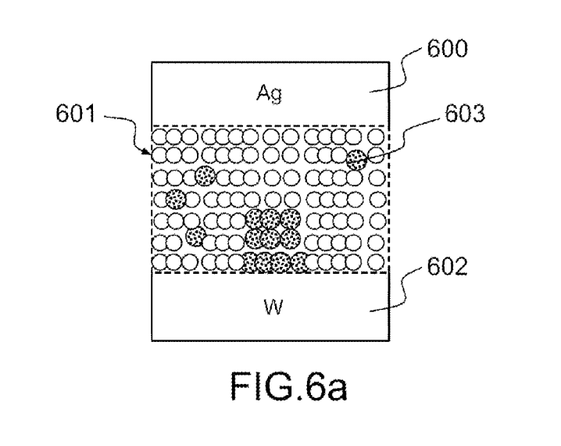
FIG. 6a schematically illustrates a CBRAM memory after the filament is broken.

FIG. 6a schematically illustrates a CBRAM memory after the filament is broken. A resistive memory of CBRAM type has an electrode made of electrochemically active metal such as silver (Ag) 600. Copper (Cu) can also be used to implement this electrode. Ag+ ions with high mobility drift through a conductive layer 601, for example of germanium sulphide (GeS2), and are reduced at a cathode 602 of tungsten (W) for example. This leads to the growth of Ag dendrites 603, i.e. to the formation of a high-conductivity filament. When this filament exists, the CBRAM circuit is in a low resistance state. Indeed, the resistance R of the circuit is then very weak. Consequently, its conductance G=1/R is very high.

When a reversal of the polarity of the voltage is applied across the terminals of the CBRAM cell, an electrochemical dissolution of the conductive bridge occurs and the circuit is then in a high resistance state. The term "system reset" is then used. In a high resistance state, the resistance of the circuit is high and consequently its conductance G=1/R is weak.

Passing from the low resistance state to the high resistance state is made possible thanks to the control of the breakage of the filament. However, it appears that a portion of the filament can survive. Such a portion of height h is represented in FIG. 6a. This phenomenon introduces a stochastic character into the behaviour of the CBRAM memory during the passage to the high resistance state.

Figure 6B:
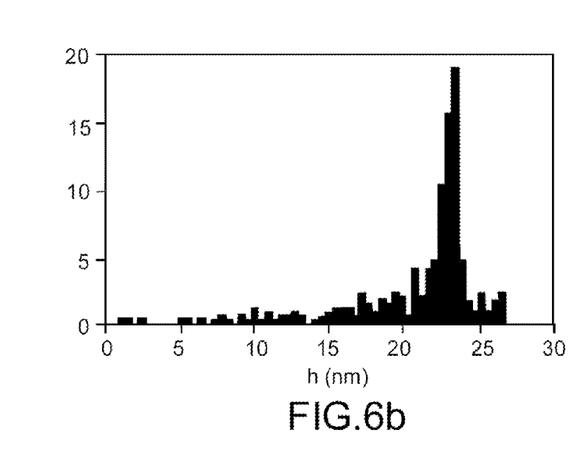
FIG. 6*b* represents the probability distribution of the remaining height h of the filament after breakage expressed in nanometres.
Figure 6C:
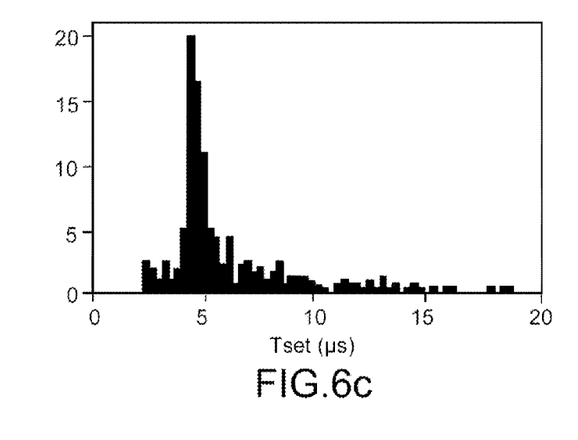
FIG. 6*c* represents the probability distribution of the time Tset to pass from the high resistance state to the low resistance state expressed in milliseconds for a voltage V applied across the terminals of the CBRAM resistive memory.
Figure 6D:
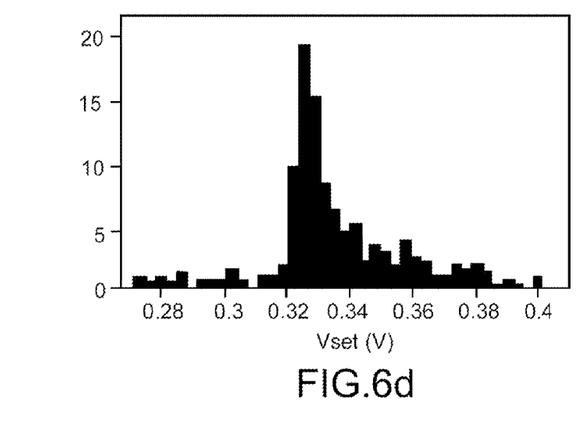
FIG. 6*d* represents the probability distribution of the voltage Vset applied across the terminals of the CBRAM resistive memory to make it switch in a time t.

FIGS. 6b, 6c and 6d correspond to three statistical distributions of physical parameters of a CBRAM resistive memory. These distributions have been computed after having triggered the switching from the high resistance state to the low resistance state, i.e. after having applied the voltage or the current adapted so that the filament of the resistive memory is created on the basis of an initial height of the conducting filament generated stochastically during the RESET phase.

FIG. 6b represents the probability distribution of the remaining height h of the filament after breakage expressed in nanometres (nm).

FIG. 6c represents the probability distribution of the time Tset of passage from the low resistance state to the high resistance state expressed in microseconds (µs).

FIG. 6d represents the probability distribution of the voltage Vset applied across the terminals of the CBRAM resistive memory.

It appears that the switchover from one state to another is not perfectly deterministic, notably for the case of resistive memories of CBRAM or PMC or EMC type, but also for other types of resistive memory, notably PCM, OXRAM, MRAM or STT-RAM memories.

Figure 7:
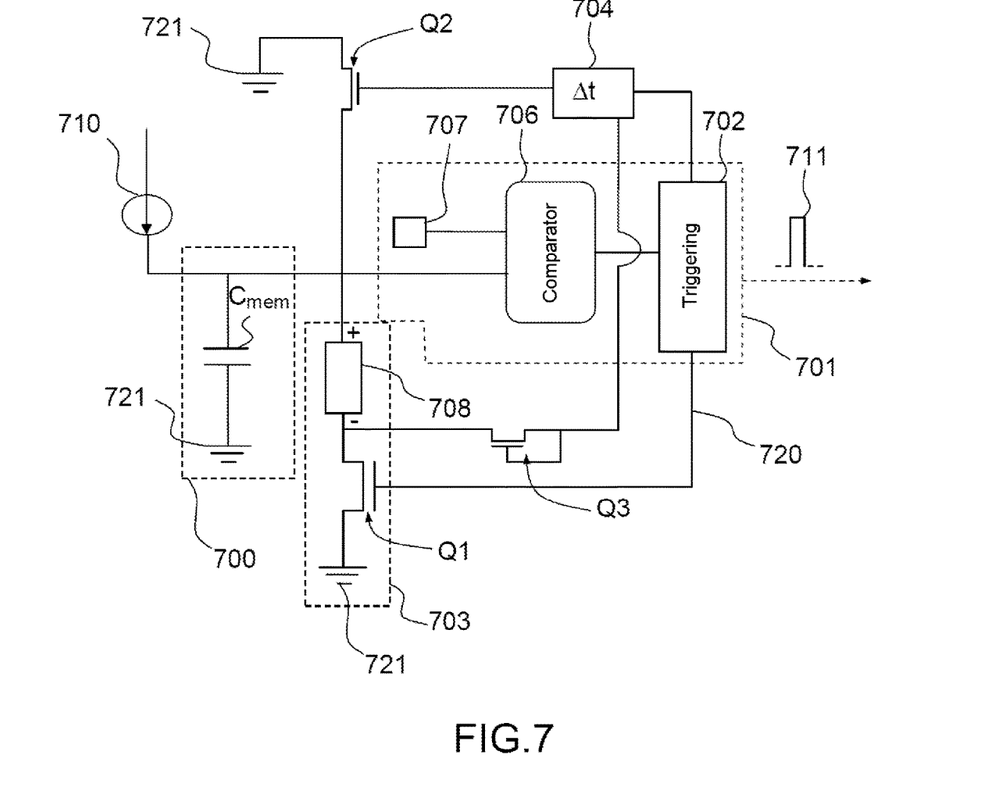
FIG. 7 gives an example of a circuit implementing an artificial neuron of S-LIF type.

FIG. 7 gives an example of a circuit implementing an artificial neuron of S-LIF type.

The architecture presented is composed of several functional blocks. Certain blocks can be found in conventional artificial neural architectures of LIF type. A current source 710 is represented and corresponds to the input current injected by the synaptic network into the artificial neuron. The circuit also comprises an integration block 700 composed of a capacitor Cmem linked to earth. A block 701 plays the same part as the block 402. It can for example be implemented using a voltage comparator 706. The output voltage Vmem of the integration block 700 is compared to a threshold voltage Vth. The threshold voltage Vth can be generated by a voltage generator 707. The comparator 706 generates a triggering signal when the voltage Vmem exceeds the threshold voltage Vth. This triggering signal corresponds for example to a binary signal comprising two states '0' and '1'. Said signal is transmitted to an output pulse generator 702 which produces a pulse 711 each time the triggering signal is transmitted with for example the state 1. This output signal can then be injected into a layer of synapse of a neuromorphic system. It is apparent that the various blocks forming the architecture of an artificial neuron of LIF type are found in this example of an artificial neuron of S-LIF type. The circuit also comprises a block 703 made up of a resistive memory 708 and of a transistor Q1. This transistor is for example of MOSFET (Metal-Oxide-Semiconductor Field-Effect Transistor) type. Alternatively, those skilled in the art can easily choose other technologies making it possible to implement a function of interruptor or selector type. Other types of transistors to MOSFETs can notably be used for this.

The resistive memory 708 is linked to the voltage line Vmem on the one hand and to the transistor Q1 on the other hand.

Initially, the resistive memory 708 is placed in its high resistance state. The input current originating from the synapses enters the artificial neuron. This has the consequence of making the charge of the capacitor Cmem increase and therefore of increasing the voltage Vmem. When the voltage Vmem reaches the threshold value Vth, the comparator 706 then generates a triggering signal and an output pulse 711 is then produced 702. In parallel with the output pulse is generated a pulse of voltage Vout 720 making it possible to control the transistor Q1 and called pulse for controlling the switching to the low resistance state. When the voltage Vout is applied at the gate of the transistor Q1, the latter plays the part of an interruptor in closed position and the resistive memory 708 switches from its high resistance state to its low resistance state. The voltage Vout must therefore be adapted so that the transistor Q1 passes into the closed position when it is applied thereto, i.e. as soon as the neuron is triggered and it generates an output pulse. The pulse 720 for controlling the voltage Vout can be identical to the output pulse 711, but another type of signal can also be generated in such a way that it makes the transistor Q1 switch at the moment the neuron is triggered.

Before each triggering of the neuron, the resistive memory must be reset to its high resistance state. In one embodiment, this reset is carried out as soon as the emission of an output pulse is terminated.

In this example, the resistive memory is of bipolar type. Thus, the reset operation can be carried out using two transistors Q2, Q3 and a delay block 704. After the resistive memory has passed to its low resistance state, the delay element 704 produces a delayed pulse of voltage for example equal to Vout at the input of Q2 and Q3. The transistor Q2 is positioned in such a way as to link the anode of the resistive memory to the earth 721 when the latter plays the part of an interruptor in the closed position. The transistor Q3 is positioned in such a way as to link the cathode of the resistive memory to the output of the delay generator 704 in such a way that the output pulse generated at the output of said generator is applied to the cathode of the resistive memory. The transistor Q3 can be replaced by a line directly linking an output of the delay generator 704 to the cathode of the resistive memory.

This mechanism makes it possible to reverse the polarity across the terminals of the resistive memory. Indeed, when Q1 changes to the open position, the voltage increases at the cathode of the CBRAM resistive memory. This translates into a voltage drop and the switching of the resistive memory to its high resistance state. The pulse needed to reset the CBRAM resistive memory can be chosen to be shorter than the minimum interval between two input pulses in such a way as to ensure that all the input signals will be taken into account by the integrator.

Figure 8:
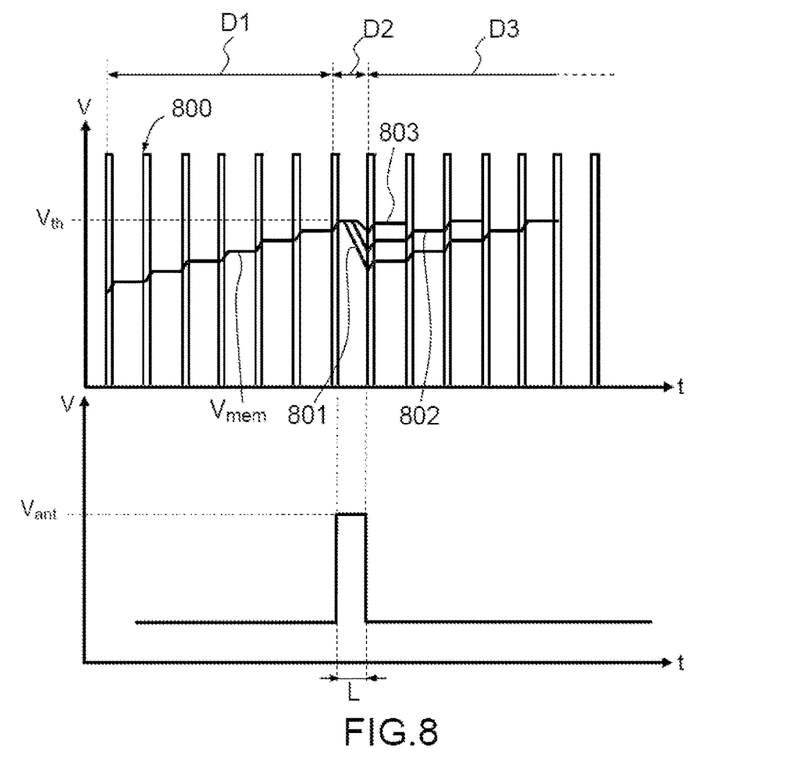
FIG. 8 illustrates the stochastic operation of an S-LIF neuron.

FIG. 8 illustrates the stochastic operation of an S-LIF neuron. The top curve represents the evolution in the voltage Vmem and the bottom curve represents the voltage applied at the gate of the transistor Q1.

In this example, an input signal corresponding to a series of pulses 800 is used. A first phase D1 of operation is illustrated. During this phase, Q1 plays the part of an interruptor in the open position. Thus, the capacitor Cmem charges and the voltage Vmem increases when a signal pulse 800 is present at the neuron input.

In a second phase D2 also called discharge cycle, the gate of the transistor Q1 is activated using a voltage control pulse Vout. Q1 then plays the part of an interruptor in the closed position. The CBRAM resistive memory 708 then passes from the high resistance state to the low resistance state. Indeed, the voltage Vmem is applied to the anode of the CBRAM and a SET operation of the resistive memory is activated. In the remainder of the description, a so-called SET operation corresponds to the switching of the resistive memory from a high resistance state to a low resistance state and a so-called RESET operation corresponds to the switching of the resistive memory from a low resistance state to a high resistance state.

The weak resistance of the resistive memory 708 induced by the SET operation as well as the closed position of the interruptor Q1 allows the current to flow to the earth 721. This has the consequence of lowering the voltage Vmem and discharging the capacitor Cmem.

The reduction of the voltage Vmem can be estimated by calculating the total time period during which the current flows through the switched CBRAM. This time period corresponds to the difference between the width L of the control pulse and the time Tset required by the CBRAM to pass to the low resistance state. As the values of Tset for resistive memories are not constant and follow a statistical distribution (FIG. 6*c*), the behaviour of this artificial neuron is not deterministic. The statistical variation in the time Tset is due to physical factors such as the dissolution of the filament inside the memory as illustrated previously (FIG. 6*b*). It should be noted that this type of phenomenon also occurs notably for resistive memories of CBRAM, PMC, EMC, PCM, OXRAM, MRAM or STT-RAM type.

The variations in the time period Tset have the consequence of varying the discharge time when a control pulse is emitted. Thus, as a function of the real value of Tset at the moment of the switching of the CBRAM memory, different durations of charge will be required before the emission of the following output peak is triggered. This means that for the following discharge cycle, the initial state of the membrane capacitance will be different. As a consequence, the quantity of incoming current is variable so as to charge Vmem to the level of Vth between two cycles of triggering of the neuron. Thus, the random nature of the time Tset allows a stochastic i.e. nondeterministic operation of the neuron. In order to illustrate this phenomenon, three curves associated with different time periods Tset have been represented 801, 802, 803.

Figure 9:
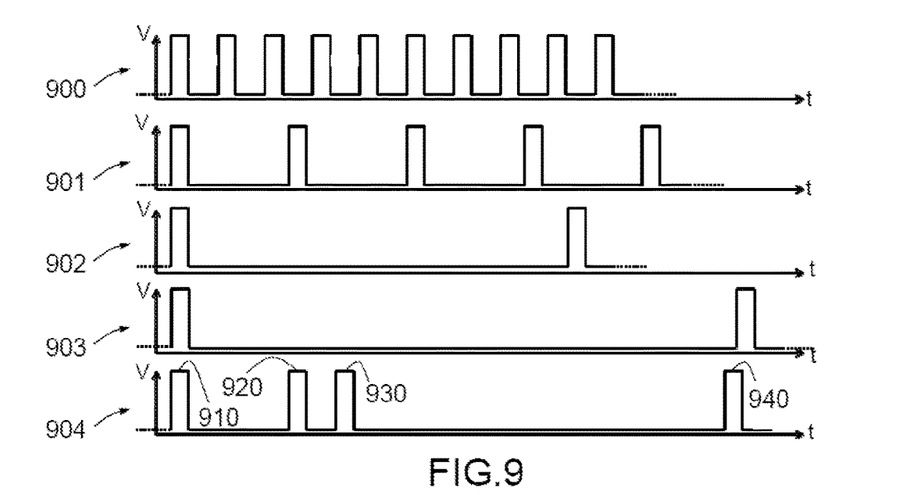
FIG. 9 comprises five curves each exhibiting a series of output pulses of an artificial neuron.

FIG. 9 comprises five curves each exhibiting a series of output pulses of an artificial neuron.

As in FIG. 8, the chosen input signal corresponds to a series of pulses, two successive pulses being spaced apart by a constant interval.

The curve 900 represents the output signal of an artificial neuron in which the value of Tset is fixed and is situated in the right-hand part of the distribution presented in FIG. 6*c*. This corresponds to the case where the time of passage from the high state to the low state of resistance is long. Thus, the capacitor Cmem discharges little over the duration of the output pulse and the voltage Vmem rapidly reaches the threshold Vth. As a consequence, the output signal corresponds to a series of pulses emitted at high frequency.

The curve 901 also represents the output signal of an S-LIF artificial neuron but with a fixed Tset value situated at the centre of the distribution represented in FIG. 6*c*. The value of Tset is therefore higher than that chosen to obtain the curve 900. As a consequence, the frequency of emission of the output pulses is lower. The curve 902 follows the same principle and corresponds to the case where the value of Tset is taken from the left-hand part of the distribution represented in FIG. 6*c*.

The curve 903 corresponds to the case of a LIF-type artificial neuron. When such a neuron is triggered, the capacitor Cmem is entirely discharged and the voltage Vmem is zeroed. The charging time for the neuron to emit a new output pulse again is then at a maximum.

The curve 904 corresponds to the real case of an artificial neuron of S-LIF type. Unlike the results obtained with the curves 900, 901 and 902 for which a constant value of Tset was chosen, here this value can vary from one triggering of the neuron to another.

In this example, a first output pulse 910 is emitted, followed by a second pulse 920. The spacing between these two pulses is the consequence of a value of Tset equal to that used to generate the curve 901. Next, the second output pulse 920 is emitted, followed by a third pulse 930. The spacing between these two pulses is the consequence of a value of Tset equal to that used to generate the curve 900. The third output pulse 930 is emitted, followed by a fourth pulse 940. The spacing between these two pulses is the consequence of a value of Tset equal to that used to generate the curve 902.

Figure 10:
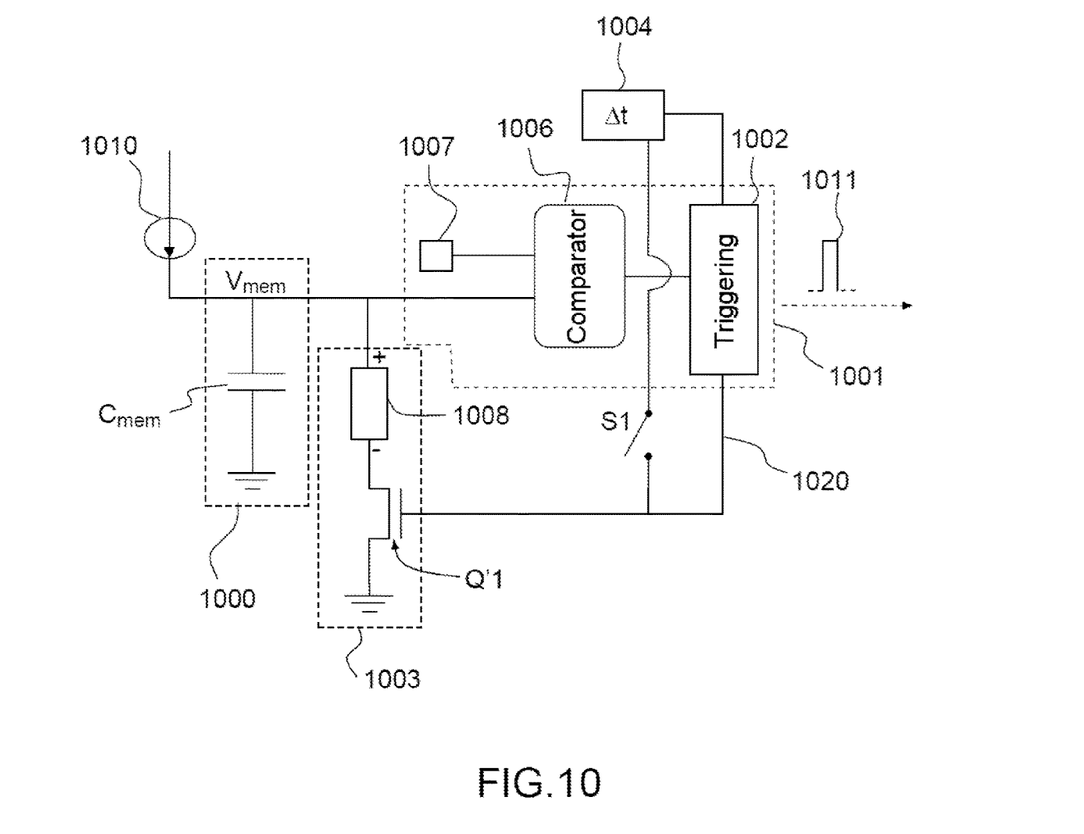
FIG. 10 represents an example of a circuit implementing an artificial neuron of S-LIF type using a unipolar resistive memory.

FIG. 10 represents an example of a circuit implementing an artificial neuron of S-LIF type using a unipolar resistive memory.

As for the case of the circuit illustrated using FIG. 7, the architecture presented here is composed of several functional blocks. Certain blocks can be found in conventional artificial neural architectures of LIF type. A current source 1010 is represented and corresponds to the input current injected by the synaptic network into the artificial neuron. The circuit also comprises an integration block 1000 composed of a capacitor Cmem linked to earth. A block 1001 plays the same part as the block 402. It can for example be implemented using a voltage comparator 1006. The output voltage Vmem of the integration block 1000 is compared with a threshold voltage Vth. The threshold voltage Vth can be generated by a voltage generator 1007. The comparator 1006 generates a triggering signal when the voltage Vmem exceeds the threshold voltage Vth. Said signal is transmitted to an output pulse generator 1002 which produces an output pulse 1011 each time the triggering signal is transmitted with for example the state 1. This output pulse can then be injected into a layer of synapse of a neuromorphic system. The circuit also comprises a block 1003 composed of a resistive memory 1008 and a transistor Q'1.

The resistive memory 1008 is linked to the voltage line Vmem on the one hand and to the transistor Q'1 on the other hand.

In this example, the resistive memory is of unipolar type. A switch S1 capable of being controlled by the delay element 1004 suffices to reset the resistive memory to its high resistance state following the triggering of the neuron.

This embodiment has the advantage of being easy to implement. Indeed, the use of additional transistors such as Q2 and Q3 is no longer necessary.

The invention claimed is:

1. A circuit for implementing an artificial neuron, said circuit comprising:
   an integrator comprising a capacitor, the integrator configured to integrate an input signal in such a way as to produce at an output a signal of voltage Vmem;
   a signal generator comprising a voltage comparator, the signal generator linked to the output of the integrator and configured to produce two output signals when the voltage Vmem is above or equal to a predetermined voltage Vth, a first signal corresponding to an output pulse of a neuron and a second signal corresponding to a control pulse Vout;
   a resistive memory comprising stochastic switching properties implemented by two terminals and able to switch from a high resistance state to a low resistance state in a time Tset following a statistical distribution specific to said resistive memory, a first terminal being linked to a terminal of the capacitor of the integrator; and
   a transistor linked to a branch at zero potential as well as to a second terminal of the resistive memory, said transistor being furthermore configured to be controlled by a second output signal of the signal generator in such a way that in a presence of a pulse of voltage Vout, the transistor is turned on making the resistive memory switch from its high resistance state to its low resistance state, the resistive memory and the transistor forming a resistive path allowing the capacitor of the integrator to discharge in order to lower the voltage Vmem,
   wherein the transistor is directly connected to the second terminal of the resistive memory and to the branch at zero potential.

2. The circuit according to claim 1, in which the resistive memory is chosen from among at least one of the following technologies: CBRAM, PMC, PCM, OXRAM, MRAM or STT-RAM.

3. The circuit according to claim 1, in which the transistor is of MOSFET type.

4. The circuit according to claim 1, in which the resistive memory is reset to the high resistance state after each switch to the low resistance state.

5. The circuit according to claim 4, in which this reset is carried out after an emission of an output pulse of the neuron is terminated.

6. The circuit according to claim 1, in which the integrator is implemented by a capacitance linked to the branch at zero potential.

7. The circuit according to claim 1, in which the resistive memory is bipolar.

8. The circuit according to claim 1, in which the resistive memory is unipolar.

9. A neuromorphic system comprising a set of at least one input neuron, a set of at least one output neuron, and a synaptic network, said synaptic network linking the set of at least one input neuron to the set of at least one output neuron, at least one of the set of at least one input neuron and the set of at least one output neuron being implemented by at least one circuit according to claim 1.

10. A circuit for implementing an artificial neuron, said circuit comprising:
    an integrator comprising a capacitor, the integrator configured to integrate an input signal to produce at an output a signal of voltage Vmem;
    a signal generator comprising a voltage comparator, the signal generator connected to the output of the integrator and the signal generator configured to produce two output signals when the voltage Vmem is above or equal to a predetermined voltage Vth, the two output signals comprising a first signal corresponding to an output pulse of a neuron and a second signal corresponding to a control pulse Vout;
    a resistive memory comprising stochastic switching properties implemented by two terminals and the resistive memory configured to switch from a high resistance state to a low resistance state in a time Tset following a statistical distribution specific to said resistive memory, a first terminal of the resistive memory being connected to a terminal of the capacitor of the integrator; and
    a transistor connected to a branch at zero potential as well as to a second terminal of the resistive memory, said transistor being configured to be controlled by a second output signal of the signal generator in such a way that in a presence of a pulse of voltage Vout, the transistor is turned on making the resistive memory switch from its high resistance state to its low resistance state, the resistive memory and the transistor forming a resistive path allowing the capacitor of the integrator to discharge in order to lower the voltage Vmem,
    wherein the transistor is directly connected to the second terminal of the resistive memory and to the branch at zero potential.

* * * * *